United States Patent

Sakai et al.

[11] Patent Number: 4,721,850
[45] Date of Patent: Jan. 26, 1988

[54] OPTICAL PICKUP DEVICE HAVING A DETECTOR FOR DETECTING THE LIGHT EMITTING INTENSITY VARIATION OF A SEMICONDUCTOR LIGHT EMITTING ELEMENT

[75] Inventors: Mitsugu Sakai; Nobuhide Matsubayashi, both of Hachioji, Japan

[73] Assignee: Olympus Optical Co., Ltd., Tokyo, Japan

[21] Appl. No.: 835,697

[22] Filed: Mar. 3, 1986

[30] Foreign Application Priority Data

Mar. 6, 1985 [JP] Japan .................... 60-32574
Mar. 20, 1985 [JP] Japan .................... 60-58026
May 31, 1985 [JP] Japan .................... 60-117858

[51] Int. Cl.⁴ .......................... G01J 1/20; G11B 7/00
[52] U.S. Cl. ................................... 250/201; 369/44
[58] Field of Search ............ 250/201 DF, 201 R, 204, 250/208, 209; 369/44, 46, 45

[56] References Cited

U.S. PATENT DOCUMENTS

| | | | |
|---|---|---|---|
| 4,074,085 | 2/1978 | Russell | 369/44 |
| 4,346,471 | 8/1982 | Hirasawa et al. | 369/44 |
| 4,518,854 | 5/1985 | Hutchin | 250/201 |
| 4,621,352 | 11/1986 | Kato | 369/46 |

Primary Examiner—David C. Nelms
Assistant Examiner—William L. Oen
Attorney, Agent, or Firm—Armstrong, Nikaido, Marmelstein & Kubovcik

[57] ABSTRACT

This invention relates to an optical pickup device using a semiconductor light emitting element provided with a light emitting mode change detecting means or the like.

14 Claims, 20 Drawing Figures

OPTICAL PICKUP DEVICE HAVING A DETECTOR FOR DETECTING THE LIGHT EMITTING INTENSITY VARIATION OF A SEMICONDUCTOR LIGHT EMITTING ELEMENT

FIELD OF THE INVENTION

Recently, the development of the information industry has rapidly increased and the amount of information to be handled continues to increase. Therefore, an optical recording or reproducing device using light beams may be effectively used instead of a recording or reproducing device recording or reproducing information by using a conventional magnetic head.

In the above mentioned optical recording or reproducing device, semiconductor lasers (or laser diodes), small in size and emitting light beams which are easily collectable, are extensively used as light sources for such an optical pickup device.

Now, in the above mentioned semiconductor laser, the light emitting output will vary depending on the temperature for other factors. Therefore, in order to record or reproduce information reliably without errors, the photo-output of the semiconductor laser must be stabilized and is generally controlled with an automatic photo-output controlling (APC) circuit.

For control with the above mentioned APC circuit, a related art example is shown in FIG. 1, for example, in a photodisc device.

That is to say, laser beams 1A and 1B are emitted respectively out of both mirror-finished end surfaces of a laser diode 1. Laser beams 1A (or front surface emitted beams) are emitted out of one end surface and are projected on to one side of disc 2 which serves as a recording medium, and the laser means 1B (or back surface emitted beams) are emitted out of the other end surface are received by monitoring photodetector 3 such as a pin photodiode.

The above mentioned laser beams 1A emitted out of one surface are made parallel beams by a collimating lens 4, then they enter an objective lens 7 through a polarizing beam splitter 5 and ¼-wavelength plate 6 and are projected in the form of a spot onto the disc 2. Beams reflected from the recording surface of the disc 2 again enter the polarizing beam splitter 5 through the objective lens 7 and ¼-wavelength plate 6.

Now, the incident beams having passed through the above mentioned polarizing beam splitter 5 are directed to disc 2 by a P-polarization, but the beams reflected by disc 2 and having passed through the ¼-wavelength plate 6 are S-polarized and are therefore totally reflected by the polarizing beam splitter 5 and are projected onto photodetector 8.

The beams having entered the above mentioned photodetector 8 are converted to electric signals and the recorded information of the disc 2 is reproduced. The photo-output of the laser diode 1 is controlled through the APC circuit 9 by the level of the photoelectric conversion signal of the above mentioned monitoring photodetector.

Also, a related art example is shown in FIG. 2 a monitoring photodetector 3' is arranged on the front surface emitted beam 1A side to control the photo-output as in Japanese Patent Laid Open No. 155789/1982.

That is to say, the front surface emitted beams 1A of the laser diode 1 are made parallel beams by the collimating lens 4 and then enter a half-mirror 11 and a part of the beams are reflected to enter the monitoring photodetector 3' but the other beams pass through the half-mirror 11, are collected by the objective lens 7 and are projected onto the disc 2. The beams reflected by the disc 2 again pass through the objective lens 7 and enter the half-mirror. The beams reflected by this half-mirror enter the photodetector 8 and are converted to electric signals to reproduce the recorded information of the disc 2. The output of the above mentioned monitoring photodetector 3' is input to APC circuit 9 to control the photo-output of the laser diode 1.

In the above mentioned conventional example wherein the front surface emitted beams 1A are detected to control the photo-output of the laser diode 1, as compared with the first conventional example wherein the back surface emitted beams 1B are detected, the light amount detected from the front surface emitted beams 1A is more accurate for control, since it is the light actually projected onto the disc.

However, in the method of controlling the photo-output with the entire amount of the emitted beams is used, if the mode changes, such a change can not yet be positively detected.

When the mode changes, the spot illuminated on the disc 2 surface will be expanded or deformed, the information will not be able to be correctly recorded on the disc and the tracking and focus control will not be able to be correctly made.

OBJECTS AND SUMMARY OF THE INVENTION

An object of the present invention is to provide an optical pickup device using a semiconductor light emitting element wherein, when the mode changes, it can be positively detected.

Another object of the present invention is to provide an optical pickup device using a semiconductor light emitting element wherein recording and reproduction can be positively made.

A further object of the present invention is to provide an optical pickup device using a semiconductor light emitting element wherein the reliability of the recording and reproducing device can be improved.

In the device of the present invention, a beam splitter is provided to split the light path from light beams emitted from a front surface of a laser diode used as a semiconductor light emitting element for recording or reproduction, a monitoring photodetector consisting of plurality divided light receiving elements is positioned to monitor light having passed through said beam splitter, the photo-output of the above mentioned laser diode is controlled in response to the total level of the light amount received by the monitoring photodetector, and a mode change detecting circuit is formed by comparing the outputs of the respective light receiving elements in order to detect a mode change.

BRIEF DESCRIPTION OF THE DRAWINGS

FIG. 3 is a schematic view showing an optical pickup device of the first embodiment.

FIG. 4 is an elevation showing the formation of a monitoring photodetector.

FIG. 5 is a circuit diagram showing the formation of a mode change detecting circuit.

FIG. 6 shows distribution views showing far field light emitting intensity patterns of laser diodes.

DETAILED DESCRIPTION OF A PREFERRED EMBODIMENTS

Figure 1:
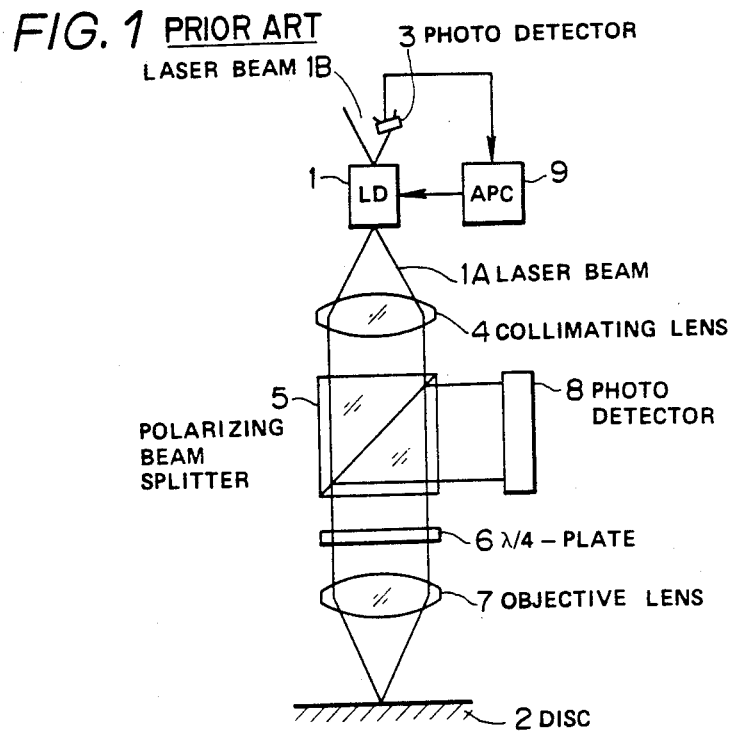
FIG. 1 is a schematic view showing an optical pickup device of a related art example.
Figure 2:
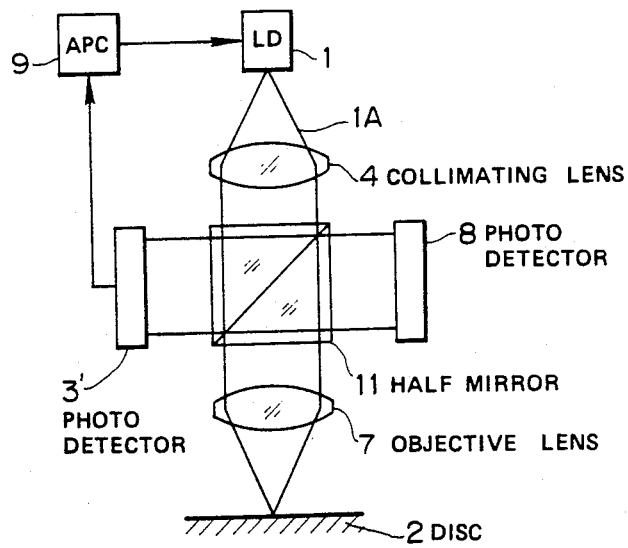
FIG. 2 is a schematic view showing an optical pickup device of another related art example.
Figure 3:
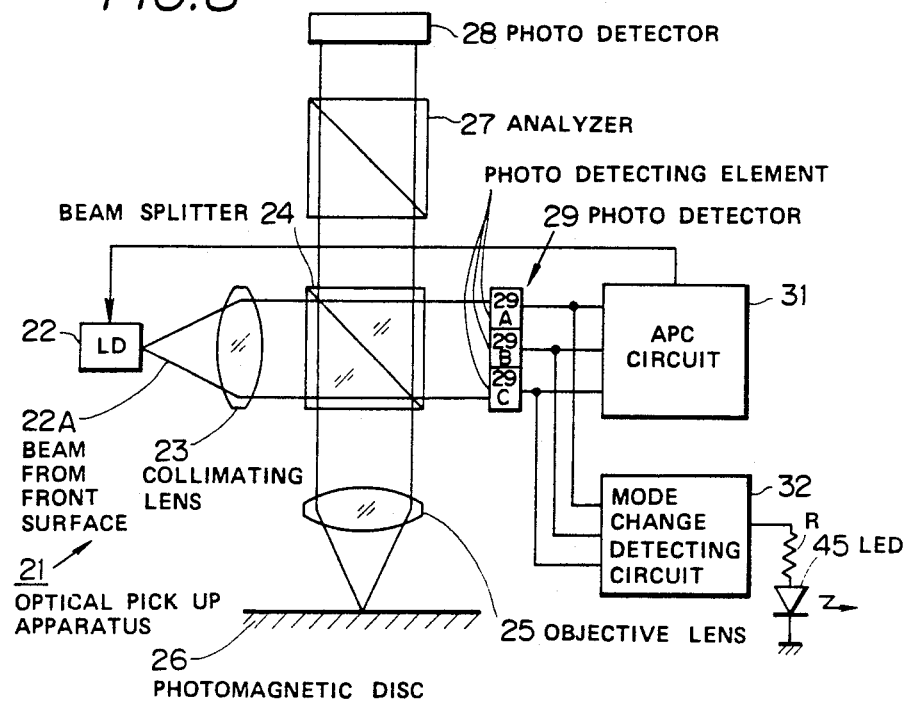
FIGS. 3 to 6 relate to the first embodiment of the present invention.
Figure 4:
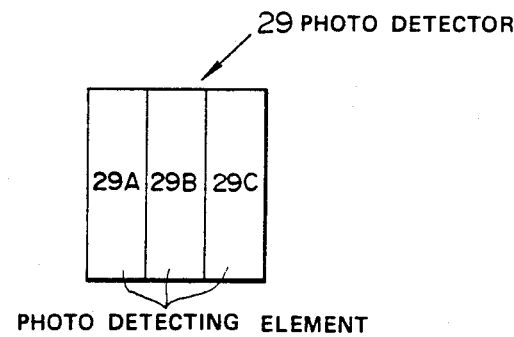

In a photomagnetic (optical) pickup device 21 shown in FIG. 3, a laser diode 22 emit light beams out of both end surfaces, and front surface emitted beams 22A emitted out of one end surface are made parallel beams by a collimating lens 23, for example, by an S-polarization and are made to enter a beam splitter 24 as a beam splitting means. This beam splitter has optical characteristics, for example, of a reflection factor $R_s=60\%$ for S-polarization and a reflection factor $R_p=0\%$ for P-polarization. Therefore, the S-polarized beams are 40% passed and are 60% reflected by beam splitter 24. In FIG. 3, the portion reflected by means splitter 24 then enters objective lens 25 and is collected to be projected in the form of a spot on a magnetic recording layer of a photomagnetic disc 26.

In a recording mode or erasing mode, the light emitting intensity (as a light power emitting time in the recording mode) of the beams projected onto the above mentioned photomagnetic disc 26 will be larger than in a reproducing mode and will be elevated to be substantially above the curie point locally on the irradiated part. In this case, as an external magnetic field is applied in the opposite direction on the photomagnetic disc 26 (as arranged opposite the photomagnetic disc 26 on he side opposite the objective lens 25) and, in the case of returning to the normal temperature, a reversed magnetic section will be formed and thus the recording or erasing will occur. Also, in the reproducing mode, the light emitting intensity of the light beams is weaker than in the above mentioned recording or erasing mode. Since the entering beams of the beams reflected by the above mentioned photomagnetic disc 26 have been linearly polarized (S-polarized), the polarizing surface will be rotated by the magnetic optical effect in response to the magnetizing direction of the magnetic recording layer. For example, if the polarizing surface rotates by $\theta$ degrees in response to the upward magnetization, the polarizing surface will rotate by $-\theta$ degrees in response to the downward magnetization.

The reflected beams for which the polarizing surface rotates pass through the beam splitter 24 and, a photo-analyzer 27, and the amount of light which passes through photo-analyzer 27 varies depending on the direction of the magnetization. The beams having passed through the photo-analyzer 27 enter a photodetector 28. The recorded information is reproduced by the photoelectric conversion output of photodetector 28. The focus controlling and tracking controlling optical systems are omitted.

A portion of the parallel beams having passed through the collimating lens 23 are not reflected by beam splitter 24, and therefore pass through beam splitter 24 and are thus projected onto monitoring photodetector 29.

Figure 5:
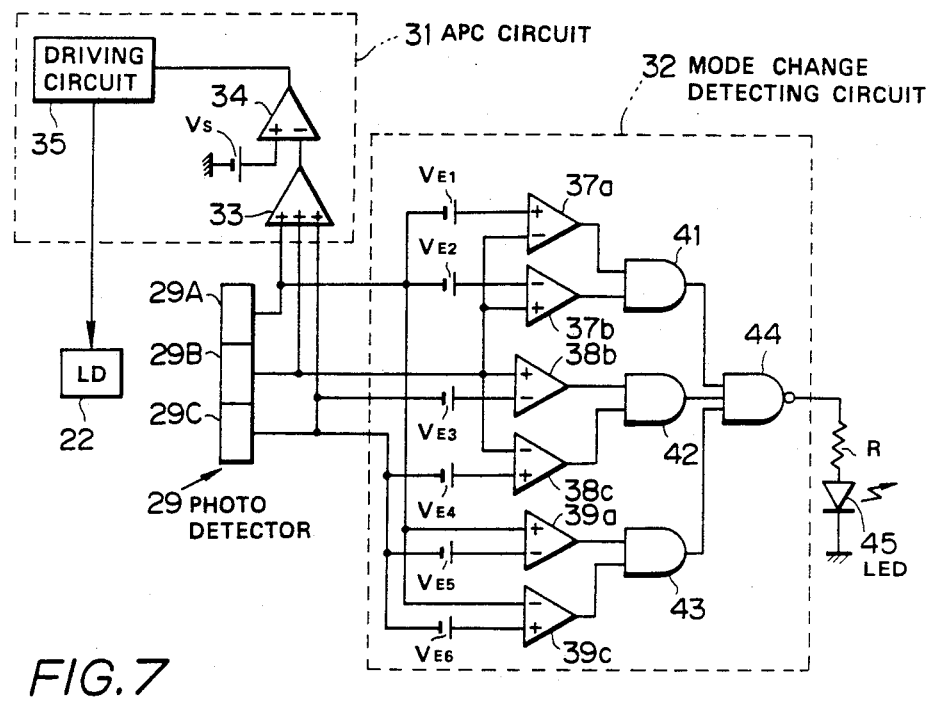

For example, as shown in FIG. 5, the above mentioned monitoring photodetector 29 consists of photodetector elements 29A, 29B and 29C (respectively having photoelectric converting functions) as of a 3-way-partitioned photodiode. An APC circuit 31 is provided controlling the photo-output of the laser diode 22 from the sum of the outputs of photodetector elements 29A, 29B and 29C. A mode change detecting circuit 32 is provided for detecting whether the output levels of the respective two of these photodetector elements 29A, 29B and 29C are within a relatively allowable level or not.

In FIG. 5, the respective outputs of photodetector elements 29A, 29B and 29C are input to adder 33 to determine the total sum of them. This (total) sum output is compared with a reference level $V_s$ in comparator 34 or the like. This compared output is input to the controlling end of a driving circuit 35 for the laser diode 22 and the photo-output of the laser diode 22 is thus controlled to have a proper intensity.

On the other hand, the outputs of the photodetector elements 29A and 29B; 29B and 29C; 29A and 29C are also input, respectively, to window type comparators 37a and 37b; 38b and 38c; 39a and 39c directly or respectively through biasing voltages $V_{E1}$, $V_{E2}$, $V_{E3}$, $V_{E4}$, $V_{E5}$ and $V_{E6}$.

The compared outputs of the respective pairs of comparators 37a and 37b; 38b and 38c; 39a and 39c are input, respectively, 2-input AND gates 41, 42 and 43. The respective outputs of the AND gates 41, 42 and 43 are input to a 3-input NAND gate 44. The high output of the NAND gate 44 illuminates a light emitting diode 45 connected in series, for example, with a resistance R, to indicate an alarm of the mode change detecting circuit 32 during a mode changing time.

Figure 6A:
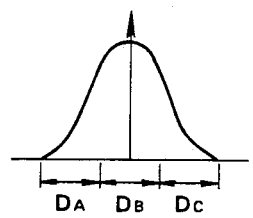

Comparators 37a and 37b, for example, have input levels set as follows:

The output of photodetector element 29B is input to the negative and positive inputs of comparators 37a and 37b, respectively. On the other hand, the output of the photodetector element 29A is input to the positive and negative inputs of comparators 37a and 37b, respectively, through the series bias voltages $V_{E1}$ and $V_{E2}$. In such a case, if the far field light emitting pattern of the laser diode 22 has a distribution pattern of a normal photo-output (oscillating mode) becoming a gaussian distribution (the abscissa representing angles and the ordinate representing light emitting intensities) symmetrical on the right and left as shown in FIG. 6a (by the way, the signs $D_A$, $D_B$ and $D_C$ represent the angular ranges of receiving the light, for example, with the respective photodetector elements 29A, 29B and 29C), then the value of the bias voltage $V_{E1}$ will be set so that the negative input level to comparator 37a on which receives the output of photodetector element 29B may be lower than the positive input level to comparator 37a which receives the output of photodetector element 29A through the bias voltage $E_1$. Further, for comparator 37b, the value of the bias voltage $V_{E2}$ will be set so that the positive input level to comparator 37b, received from the output of the photodetector element 29B may be higher. Therefore, in the case of the normal photo-output distribution pattern, the compared outputs of both comparators 37a and 37b will be high and the output of the AND gate 41 will also be high.

The other pair of comparators 38b and 38c also operate in the same manner. In comparator 38b, the value of the bias voltage will be set so that the input level to comparator 38b from the output of photodetector 29b may be higher than the other input level to comparator 38b from the output of the other photodetector element 29C. In the other comparator 38c, the value of the bias voltage will be set so that the end level may be reverse. The other pair of comparators 39a and 39b also operate in the same manner.

In other words, in the normal light emitting output distribution pattern, the outputs of all the comparators 37a and 37b; 38b and 38c; 39a and 39c will be high, the outputs of the AND gates 41, 42 and 43 will also be high, the output of the 3-input NAND gate 44 will be low and thus the light emitting diode 45 will not light.

Figure 6B:
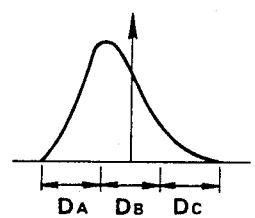
Figure 6C:
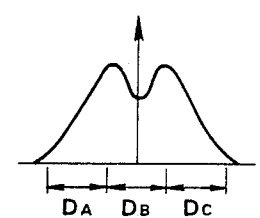

However, when the normal photo-output distribution shown in FIG. 6a changes to a photo-output distribution shown, for example, in FIG. 6b, the output of the photodetector element 29C will become smaller but, on the other hand, the output of the photodetector element 29A will become larger. Therefore, in this case, for example, the output of the comparator 39c in the pair of comparators 39a and 39c will be low, the output of the ANd gate 43 will thus also be low, the output of the 3-input NAND gate 44 will then be high and the light emitting diode 45 will be illuminated to signal an alarm that the mode has changed. When photo-output distribution becomes lower in the middle portion as shown, for example, in FIG. 6c, the output of the comparator 37b in the pair of comparators 37a and 37b will be low, the output of the comparator 38b in the pair of comparators 38b and 38c will be low and thus light emitting diode 45 will be illuminated.

According to the above mentioned first embodiment, the beams to be projected on the photomagnetic disc 26 side are split by the beam splitter 24, and the portion not directed to photomagnetic disc 29 is received by the 3-way-partitioned monitoring photodetector 29. The photo-output of the laser diode is controlled by the APC circuit 31 receiving substantially all the light amount passing straight through the beam splitter. The beams are divided and received by respective photodetectors 29A, 29B and 29C and are compared with each other. A pattern of change, that is, whether the light emitting output distribution pattern is changed or not, is detected, and therefore, the change of the oscillating mode can be detected and the deterioration and life of the laser diode can be positively known. Therefore, the actual deterioration of the laser diode can be positively known and it can be replaced before failing completely. Further, when pickup device 21 is used, recording and reproduction can be made on a proper level without errors and the reliability of the recording or reproducing device will be improved.

Further, it should be noted that if LED's having different colors than LED 45 are connected to the respective outputs of the AND gates 41, 42 and 43 and these LED's are all lit, the mode has not been changed. The alarming or confirming means is not limited to the LED 45.

Figure 7:
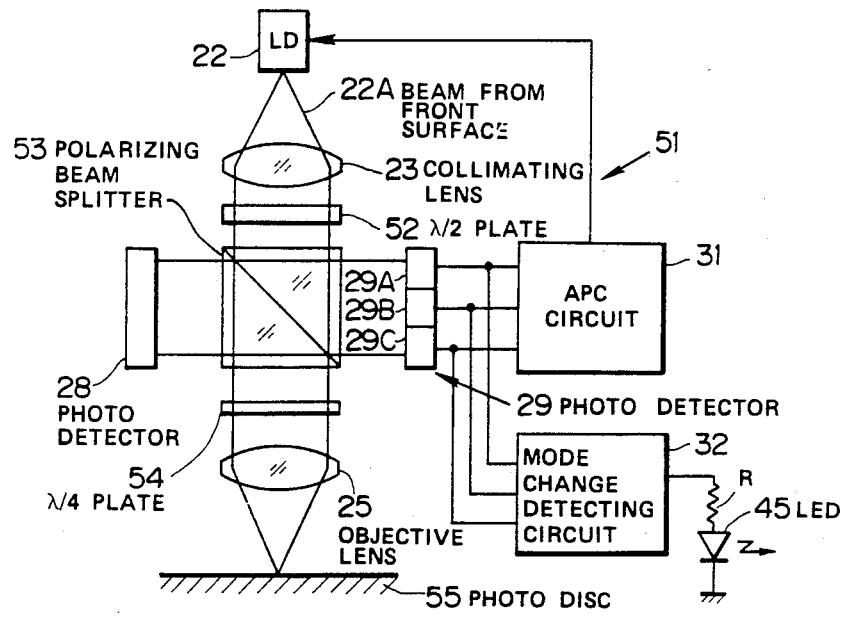
FIG. 7 is a schematic view showing an optical pickup device of the second embodiment of the present invention.

FIG. 7 shows the second embodiment of the present invention.

The optical pickup device 51 in this embodiment is for a photodisc.

The front surface emitted beams 22A emitted from one end surface of laser diode 22 are made parallel beams by collimating lens 23, for example, by P-polarization, are rotated in the polarizing direction by a ½-wavelength plate 52, are set to have some S-polarized components and then enter a beam splitter 53. By this polarizing beam splitter 53, most of the P-polarized waves are passed and the S-polarized components are reflected to enter the 3-way-partitioned monitoring photodetector 29 used in the first embodiment. The above mentioned passed P-polarized linear waves are circularly polarized by a ¼-wavelength plate 54 and are projected onto a photodisc 55 by the objective lens 25. The beams reflected from photodisc 55 pass through objective lens 25, are made S-polarized (linear) waves by the ¼-wavelength plate 54, enter the polarizing beam splitter 53, are reflected by this polarizing beam splitter 53 and enter the photodetector 28.

The above mentioned monitoring photodetector 29 consists of three divided photodetector elements 29A, 29B and 29C as in the first embodiment. The APC circuit 31 is formed by taking the sum of the respective outputs of photodetector 29 and the mode change is detected by the mode change detecting circuit 32.

In this second embodiment, the beams 22A emitted from laser diode 22 are split by beam splitter 53 and the reflected portion is received by monitoring photodetector 29 after passing through ½-wavelength plate 52 and polarizing beam splitter 53. Similar to the first embodiment, the emitted light output from the laser diode is controlled and the mode change is detected.

Further, the angle (set around the optical axis of the collimating lens 23) of the laser diode 22 may be adjusted without using the ½-wavelength plate 52.

In the above described respective embodiments, the monitoring photodetector is formed of three divided photo-detector elements but the present invention is not limited to this but may have 2, 4 or more divided elements (plurality of photodetector elements, generally the more the better). The shape of the respective photodetector elements is not limited to be rectangular or square but may be any other shape. In short, the change of the far field pattern may be detected. Also, the monitoring photodetector is not limited to be formed of a plurality of adjacent photodetector elements. A lens may be interposed in the light path. The circuit formation of the mode change detecting means is not to be limited as shown in FIG. 5. Further, the AND gate 41, 42 and 43 and NAND gate 44 can be replaced with a 6-input NAND gate. For example, in the case of a simplified formation, in FIG. 5, two pairs of window-type comparators (for example, 37a and 37b; 38b and 38c) may be formed. further, in order to detect the degree of the mode change, in FIG. 5, for example, the relative allowable level with the photodetector elements 29a and 29B is defined by the pair of comparators 37a and 37b. However a pair of comparators set (for example, extensively set) so that this allowable level may be different may be respectively provided so that, in case this comparator output is low, an alarm may indicate that the deterioration of the laser diode will be larger than in the case of the above described comparator output. For example, a buzzer may be sounded or it may be made known that the laser diode should be replaced.

Further, the present invention can be extensively applied in the case of recording and/or reproducing information in an optical recording medium by utilizing beams. In case such comparatively low intensity beams as in the case of reproduction may be used, not only a laser diode but also a light emitting diode or any other semiconductor light emitting element may be used as a light source.

In the above mentioned respective embodiments, the APC circuit 31 receives the front surface emitted beams 22A of the laser diode 22 but back surface emitted beams may be used instead of the front surface emitted beams 22A. Needless to say, it is desirable that, in the mode change detecting circuit 32, the front surface emitted beams 22A are received by a plurality of photodetector elements. When the APC circuit 31 is operated by using the above mentioned back surface emitted beams, a monitoring photodiode or the like may be provided, however, a photodiode enclosed integrally with the laser diode 22 within a package may also be used.

As described above, according to the present invention, the light beams emitted from the recording medium side of the laser diode (front surface emitted beams) are split on the way and a portion are received by the monitoring photodetector consisting of a plurality of photodetector elements to control the photo-output and detect the mode change. Therefore the change of the oscillating mode can be positively detected. Therefore, the deterioration or life of the laser diode can also be accurately judged. further, the optical pickup can be always operated without any mode change. Thus, tracking and focus control of high precision can be made. Also, recording and reproduction can be made always in a proper state and with few errors. The reliability of the recording or reproducing device is thus improved.

Figure 8:
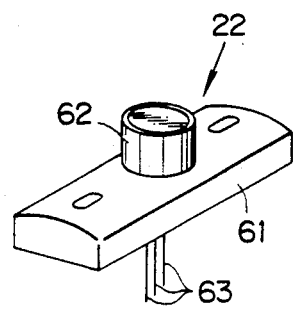
FIG. 8 is a perspective view showing the contour of a laser diode.

The laser diode is illustrated in FIG. 8. A cap 62 is secured to a base 61 made of a metal and is covered on the upper surface with a transparent member such as glass so that, when an electric current is fed through terminals 63, beams of light discharged from laser diode chips fitted to base 61 inside cap 62 may be radiated out through the above mentioned transparent member.

Now, the base of the above mentioned laser diode is in contact on one surface thereof with the wall surface of a pickup body and is fixed with screws or the like so that the heat from the operation of the laser diode may be dissipated through the wall surface in contact with base 61.

Problems arise when the above mentioned heat is not sufficiently dissipated, and the life of the laser diode will thus be decreased. Further, problems occur when the temperature rises, even if the driving current is increased, it will then be difficult to obtain an aimed light emitting power, and even if the laser diode is used in this state, its life will be decreased.

In the device of the prior art, the pickup body does not have good contact with the base 61 and therefore an insufficient heat dissipating effect has been obtained. Particularly, in a photomemory device which can record, wherein high power such as of 20 to 30 mW is oscillated for recording and therefore a sufficient heat dissipating means is required.

Therefore, in the present invention, as described below, a flexible sheet high in thermal conductivity is fitted between the semiconductor light emitting element and the fitting surface of the pickup body to which the semiconductor light emitting element is fitted, so that the contact area may be increased, the heat resistance may be decreased and the heat may thus be sufficiently dissipated.

Figure 9:
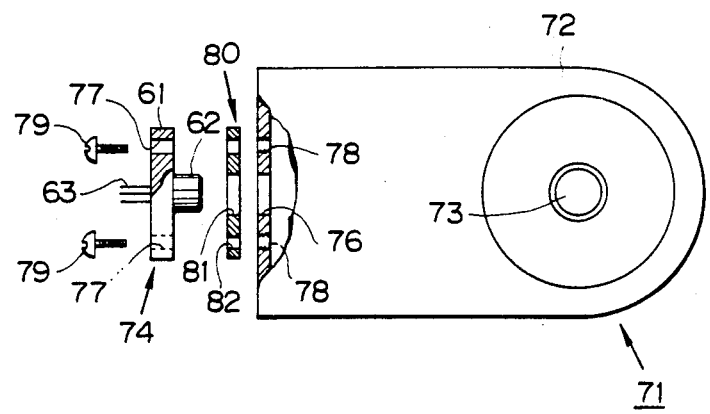
FIG. 9 is a plan view showing an optical pickup device with laser diode fitting members disassembled.

In an optical pickup device 71, as shown in FIG. 9, a cylindrical housing is provided to project from one end side of the upper surface of the pickup body 72 so that, when an actuator (objective lens driving device) housed within the cylindrical housing is driven and controlled, the focus may be adjusted by moving the objective lens 73 in a direction perpendicular to the surface of the optical recording disc and the track may be checked by moving the objective lens in parallel with the above mentioned surface.

A laser diode fitting part is formed on the other end side of the above mentioned pickup body 72.

In the above mentioned fitting part, an opening 76 in which the cap 62 of a laser diode 74 can be fitted is formed in the center of the plane outer wall surface and screw holes 78 which can communicate with fitting holes 77 provided in the base 61 of the laser diode 74 are formed on both sides of the opening 76.

Figure 10:
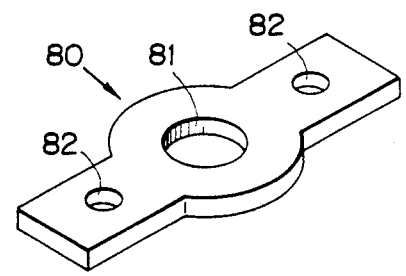
FIG. 10 is a perspective view showing a heat dissipating sheet to be used in the embodiment of FIG. 9.

The laser diode 74 can be fixed to the pickup body 72 by fitting the cap 62 in the above mentioned laser diode 74 as a semiconductor light emitting element into the opening 76 in the pickup body 72 and passing screws 79 through the fitting holes 77 provided in the base 61. In this embodiment, it is a feature that such heat dissipating sheet 80, as shown in FIG. 10, is to be interposed and fitted between the base 61 and the fitting part.

The above mentioned heat dissipating sheet 80 is made of a flexible material high in the thermal conductivity. This sheet is molded to conform substantially to the area and shape of base 61. An opening 82 through which the cap 62 can be passed is formed in the center of the sheet and holes 82 which can communicate with the fitting holes 77 of the base 61 are provided on both sides of the opening 81.

A flexible high molecular weight sheet to which is added, for example, boron nitride (BN) can be used as a material for the above mentioned heat dissipating sheet 80 and is high in the thermal conductivity and flexibility.

When the above mentioned heat dissipating sheet 80 is interposed and fitted between the laser diode 74 and the fitting part of the pickup body 72, as shown in FIG. 9, even when the surface on which cap 62 projects from is in the form of a cylindrical convex lens or any other surface shape, it will be in close content with the heat dissipating sheet 80 due to the flexibility of the heat dissipating sheet 80 in order to reduce the heat resistance.

Therefore, when beams are emitted from laser diode 74 by feeding an electric current to terminals 63 and are formed into a spot on a recording medium (not illustrated) to record or reproduce information, even when the laser diode is operated in a high power photo-output state particularly in recording, the heat generated in the laser diode 74 will be so quickly dissipated on the pickup body 72 side by the heat dissipating sheet 80 that the temperature rise of the laser diode 74 will be prevented.

Figure 11:
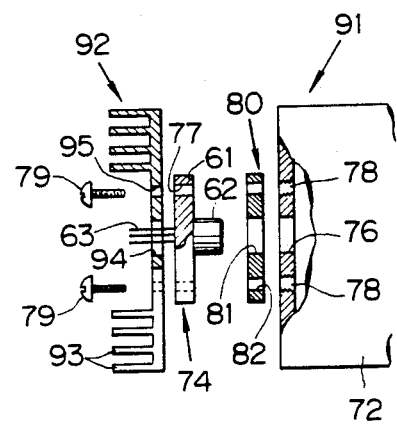
FIG. 11 is a plan view showing a part of another optical pickup device with laser diode fitting members disassembled.

FIG. 11 shows another optical pickup device.

Figure 12:
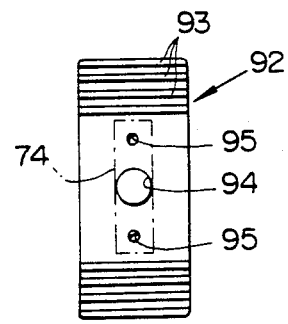
FIG. 12 is an elevation showing a heat dissipating fin used in the device shown in FIG. 11.

In optical pickup device 91, in addition to the heat dissipating sheet 80 interposed and fitted between the laser diode 74 and the fitting part to which the laser diode 74 is fitted as in the above mentioned embodiment shown in FIG. 9, on the surface (which shall be referred to as the back surface hereinafter) on the side opposite the cap 62 of the laser diode 74, a heat dissipating fin 92 is fixed together in close contact with the back surface of laser diode 74. As shown, in FIGS. 11 and 12, on one side of the surface substantially of the same shape as the rectangular shape on the end surface of the pickup body 72, projections 93 projecting in the direction perpendicular to the above mentioned surface are provided. An opening 94 through which the terminals 63 of the laser diode 74 are to be passed is formed in the center of this fin 92. Fitting holes 94 are provided on both sides of the opening.

The material of the above mentioned fin 92 is preferably, for example, an aluminum metal which is high in the thermal conductivity and is light in weight (because of a load when pickup 91 is movable).

According to this embodiment, as the fin 92 is further provided the temperature can be more effectively prevented from rising.

Figure 13:
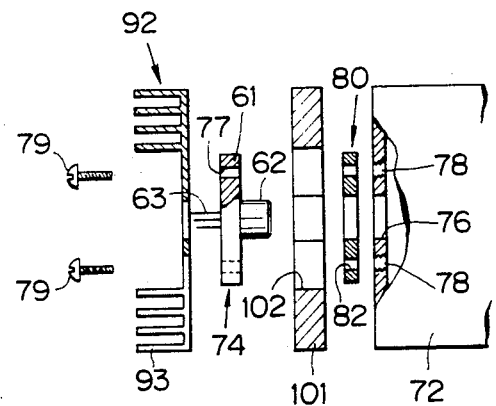
FIG. 13 is a plan view showing laser diode fitting members as disassembled.

FIG. 13 shows further another embodiment.

Figure 14:
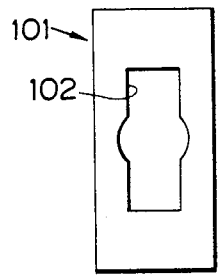
FIG. 14 is an elevation showing a heat dissipating sheet to be used in the device shown in FIG. 13.

In this embodiment, a heat dissipating sheet 101 being flexible and high in the thermal conductivity is further fitted and fixed on the outer periphery of the laser diode 74 in the above mentioned embodiment shown in FIG. 11. therefore, an opening 102 (see FIG. 14) of a shape somewhat larger than the contour of the above mentioned heat dissipating sheet 101.

Also, the material of this heat dissipating sheet 10 can be the same material as in the embodiment shown, for example, in FIG. 10. Such a metal plate as aluminum may be combined with the heat dissipating sheet made thinner by the thickness of this metal plate.

When the above mentioned heat dissipating sheet 101 is fitted, in the case the heat dissipating fin 92 become higher in temperature than the pickup body 72, the accumulated heat will be able to be dissipated onto the pickup body 72 side by thermal conduction. Also, when the above mentioned heat dissipating sheet 101 is fitted, when the laser diode 74 is fitted, the displacement in the optical axis direction can be reduced.

In the above mentioned embodiment shown in FIG. 13, the heat dissipating sheet 101 may be provided with fitting holes on the surface so as to be fixed with screws or the like.

The fin 92 in the embodiment shown, for example, in FIG. 11 can be fixed to the laser diode 74 and to the pickup body 72.

Further, the heat dissipating fin is not to be limited to the illustrated shape.

Also, the heat dissipating sheet (for example, reference numeral 80) may be fitted to the surface from which the terminals 63 of the above mentioned laser diode 74 project and may be fixed to the heat dissipating fin (for example, reference numeral 92) or to the fitting plate and this fin or the plate may be fixed to the pickup body 72 directly (or through the heat dissipating sheet). The fitting part on the pickup body 72 is not limited to be on the exposed outer surface but may also be on the inside surface.

Further, a grease or the like high in the thermal conductivity can be applied to the contact surface in fitting.

The semiconductor light emitting element is not limited to be laser diode 74, but may be a semiconductor light emitting element such as a light emitting diode (LED), for example, only in the case of reproduction.

When the monitoring photodiode is enclosed integrally with the laser diode for the optical pickup device and the laser diode side and photodiode side are connected to the driving device through separate conductors, the photo-output of the laser diode may not be controlled on a proper level. Therefore, this disadvantage can be prevented by the following structure.

Figure 15:
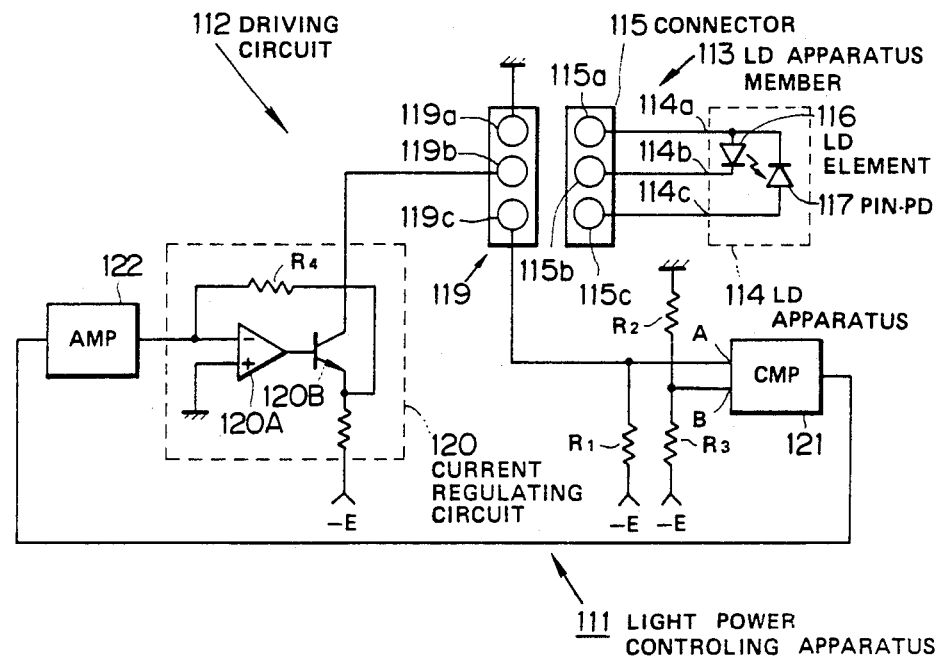
FIG. 15 is a circuit diagram showing the formation of a laser diode driving device.

That is to say, as shown in FIG. 15, a photo-output controlling apparatus 111 of a laser diode forming an optical pickup device is formed of a driving circuit 112 and a laser diode apparatus member 113 detachably fitted to this driving circuit 112.

Figure 16:
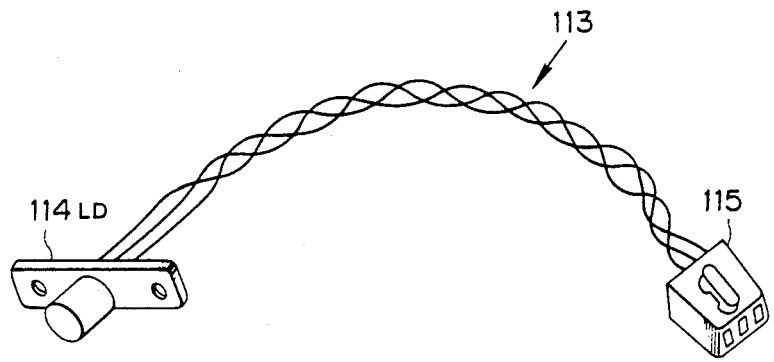
FIG. 16 is a perspective view showing a laser diode device part made integral with a connector.

As shown in FIG. 16, this laser diode apparatus member 113 consists of a laser diode 114 and a connector 115 for connecting the laser diode 144 to the driving circuit 112 through lead wires connected to electrodes of the laser diode 114.

The laser diode 114 used in this embodiment is generally extensively marketed and has a shape as shown in FIG. 16.

In this laser diode 114, a laser diode element 116 is a semiconductor light emitting element, and a pin photodiode 117 is a monitoring semiconductor photoelectric converting element. Both are contained in the same package. As shown in the equivalent circuit in FIG. 15, the first terminal 114a is common with the anode of laser diode element 116 and the cathode of pin photodiode 117, the second terminal 114b is connected to the cathode of the laser diode 116, and the third terminal 114c is connected to the a node of the pin photodiode 117.

The above mentioned three terminals 114a, 114b and 114c are connected respectively to the respective terminals 115a, 115b and 115c of a connector 115 having three terminals 115a, 115b, 115c, through respective lead wires so that noises mixed in may be reduced.

On the other hand, the driving circuit 112 of FIG. 15 is provided with a connector receiver 119 to which the above mentioned connector 115 is fitted.

The respective terminals 119a, 119b and 119c of receiver 119 made to be connected with the respective terminals 115a, 115b, and 115c of the connector 115.

The first terminal 119a of the above mentioned connector receiver 119 is connected to ground, the second terminal 119b is connected to the collector of an output transistor 120B of a current regulating circuit, and the third terminal 119c is connected to input A of comparator 121.

Input A of comparator 21 is also connected to the terminal of a negative voltage $-E$ through a resistance $R_1$. The other input B (for example, a reversed input) of comparator 121 is held to a reference potential level dividing the ground (0) potential and the negative potential $-E$ with the resistances $R_2$ and $R_3$. The anode potential of the photodiode 117 varying in response to the received light amount is compared with this reference level. A difference voltage corresponding to the displacement from this reference level is amplified by amplifier (AMP) 122 and is then input to the current regulating circuit 120.

The above mentioned current regulating circuit 120 has a differential amplifier 120A and an output transistor 120B connected to the output of differential amplifier 120A. The output of amplifier 122 is input to the negative input of differential amplifier 120A. The positive input of differential amplifier 120B is connected to ground. On the other hand, the negative input is also connected to the emitter of the output transistor 120B through a resistance $R_4$, and the signal input from the amplifier 122 is reversely amplified to control the current on the load side.

That is to say, when the above mentioned connector 115 if fitted to the connector 119, the output of the pin photodiode 117 will be input to input A of comparator 121 and will be compared with the reference potential level of the other input B of comparator 121. The difference between both of these input potential levels will be detected by comparator 121 and the output will be input to the current regulating circuit 120 through the amplifier 122 to control the current flowing through the laser diode element 116 connected to the load side of this current regulating circuit 120 and to automatically control the output to control the photo-output of this laser diode element 116 to negatively return to a constant value. According to this embodiment, when laser diode element 116 and the respective electrodes of the pin photodiode 117 are made integral and are fitted to or detached from the corresponding connector receiver 119, the terminals 114a, 114b and 114c will be set to be connected as a whole (not individually) or not to be connected as a whole (not individually). Therefore, the state in which the laser diode element 116 side is connected but the pin photodiode 117 side is not connected (which state often occurs in the prior art example) will rarely occur and the laser diode element 116 will be prevented from being destroyed by excess current.

Further, according to this embodiment, there is an advantage in that one attaching or detaching operation will do.

Additionally, this embodiment and the embodiment in FIG. 3 (FIG. 5) or FIG. 7 can be used combined.

That is to say, the driving circuit 112 in FIG. 15 is used as the APC circuit of FIG. 3. In such a case, the driving circuit 112 will receive the back surface emitted beams of the laser diode element 116 to control the photo-output of the laser diode element 116. On the other hand, the mode change detecting circuit 32 may check the front surface emitted beams with a plurality of photodetector elements 29A, 29B and 29C.

Figure 17:
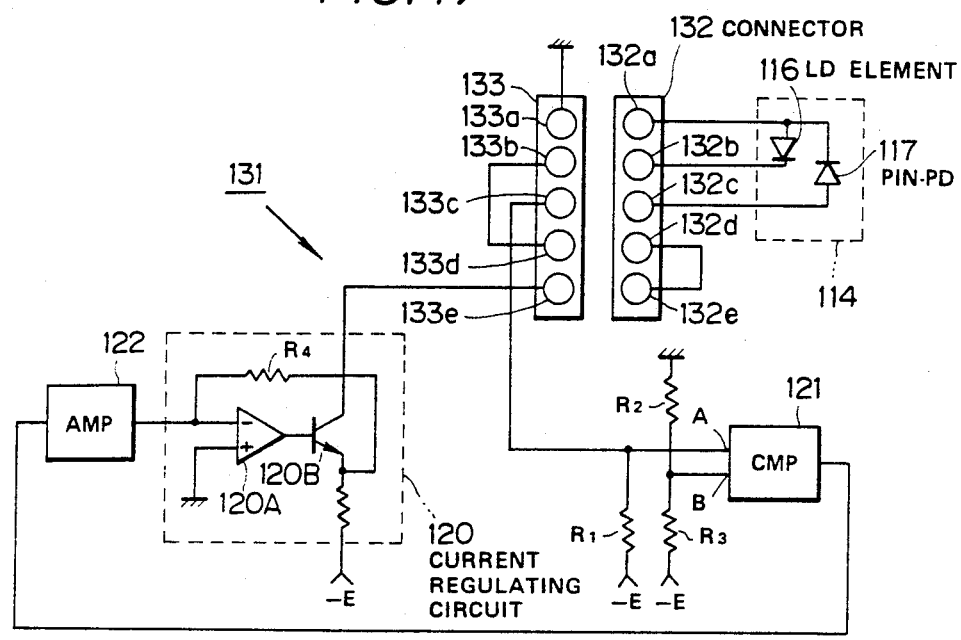
FIG. 17 is a circuit diagram showing another embodiment of a driving device.

FIG. 17 shows another embodiment of the photo-output controlling device.

In the driving device 131 of this embodiment, the connector 115 and connector receiver 119 of the above mentioned embodiment shown in FIG. 15 are replaced by a connector 131 and connector receiver 133 having respectively 5 terminals.

The first to third terminals 132a, 132b and 132c of the above mentioned connector 132 are connected to the laser diode 114 as in the above mentioned embodiment and the fourth and fifth terminals 132d and 132e are connected with each other.

On the other hand, in the connector receiver 133, the first and third terminals 133a and 133c are the same as in the case of the above mentioned embodiment, the second terminal 133b is connected to the fourth terminal 133d and the fifth terminal 133e is connected to the output transistor 120B.

Therefore, when connector 132 is fitted to the connector receiver 133, if the first and third terminals 132a and 132c are connected to the corresponding terminals 133a and 133c, the pin photodiode 117 will be set in the operating state but, unless not only the first terminal 132a but also the second, fourth and fifth terminals are connected, no current will flow through the laser diode element 116 and therefore the laser diode element 116 side will be positively prevented from only being electrically connected when the connection is insufficient or the like.

Figure 18:
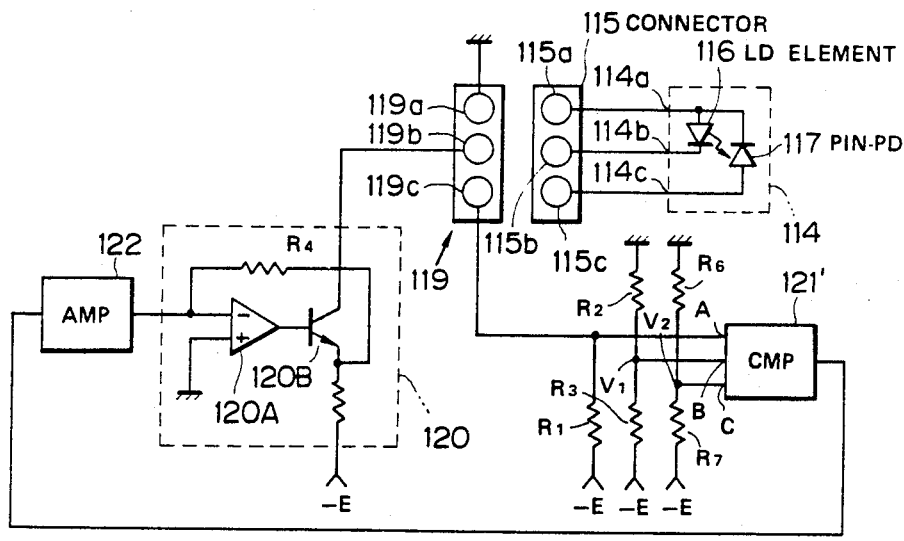
FIG. 18 is a circuit diagram showing another embodiment of a driving device.

FIG. 18 shows further another embodiment of the photo-output controlling device. In this embodiment, the comparator 121 in the embodiment shown in FIG. 15 is replaced by a window type comparator 121'. The second reference potential $V_2$ is input to the third input of comparator 121' through resistances $R_6$ and $R_7$ and is set to be on a level considerably lower than the above described reference potential (represented by $V_1$).

When the level applied to input A is higher than the reference potential $V_2$, comparator 121' will perform the operation of the above mentioned embodiment shown in FIG. 15. That is to say, when the connector 115 is correctly connected to the connector receiver 119, the light emitting intensity of the laser diode element 116 will be controlled by the reference potential $V_1$. Further, when the pin photodiode 117 is not correctly connected or the optical current is too small, if the level of the input A is lower than the reference potential $V_2$, the output of the comparator 121 will be, for example on a high level and will e held above the zero level at the reverse input end of the current regulating circuit 120 through the amplifier 122 and no current will flow through the laser diode element 116.

Therefore, when connector 115 is connected, if the terminal 115c connected, for example, to the anode of the pin photodiode 117 is connected in poor contact with the terminal 119c of the connector receiver 119, no current will flow through the laser diode element 116 and the laser diode element 116 can be protected.

In the above mentioned driving device, the laser diode 114 is not limited to be of such formation or contour as is shown in FIG. 15 or 16 but can be extensively applied to the formation wherein the respective electrodes of the laser diode and a semiconductor photoelectric converting element such as the pin photodiode or avalanche diode are connected to the connector receiver on the driving circuit side through an integrated connector.

Also, it can be applied to the case of using such semiconductor light emitting element as the light emitting photodiode instead of the laser diode forming the driving device.

Further, the driving circuit controlling the photo-output is not limited to the one shown in FIG. 15 and other figures, but any other circuit formation can be extensively applied.

According to the light output controlling device of each of the above mentioned embodiments, the semiconductor light emitting element and the photodetector element monitoring the photo-output of the semiconductor light emitting element are connected to the driving circuit controlling the oscillated light amount of the light emitting element through the integrated connecting means and therefore the semiconductor light emitting element side can be positively prevented from being electrically connected alone and thus the semiconductor light emitting element can be effectively prevented from being destroyed by the flow of an excess current.

It is apparent that the working modes different in a wide range can be formed without departing from the spirit and scope of the present invention. The present invention is not restricted by the specific working mode except as limited in the appended claims.

What is claimed is:

1. An optical pickup device using a semiconductor light emitting element, comprising:
    a semiconductor light emitting element emitting a light beam from at least one end surface thereof;
    a beam splitting element for splitting said beam into a reflected beam and a passing beam;
    an objective lens for collecting one of said reflected beam and said passing beam from said beam splitting element and projecting said one beam onto an optical recording medium;
    an information photodetector means for receiving a beam reflected from said recording medium and reproducing the information recorded in said recording medium;
    a plurality of photodetecting means, receiving the other one of said reflected beam from said beam and said passing beam splitting element, for detecting the change in the intensity distribution of the light beam radiated from the semiconductor light emitting element, each photodetecting means outputting a photoelectric conversion signal;
    a mode change detecting circuit means, operatively coupled with said photodetecting means, for detecting the change in the intensity distribution of the light beam radiated from said semiconductor light emitting element by comparing the photoelectric conversion signals from said plurality of photodetecting means, and outputting a mode change signal; and
    a photo-output controlling means, operatively coupled with said photodetecting means and said light emitting element for controlling the photo-output of said semiconductor light emitting element in response to the photoelectric conversion output signals from said photodetecting means.

2. An optical pickup device according to claim 1 wherein said one beam projected onto said recording medium is linearly polarized and said information photodetector means is a photomagnetic system which receives the reflected beam from the recording medium and having passed through an analyzer.

3. An optical pickup device according to claim 1 wherein a ¼-wavelength plate is interposed between said beam splitting element and said objective lens, such that a circularly polarized beam is projected onto said recording medium through said ¼-wavelength plate and the reflected beam is linearly polarized by said ¼-wavelength plate and then transmitted to said information photodetector means through said beam splitting element.

4. An optical pickup device according to claim 1, wherein said mode change detecting circuit means determines whether or not the photoelectric conversion signal from each photodetecting means is within a predetermined threshold level and issues said mode change signal when at least one of said signals is outside of said threshold level.

5. An optical pickup device according to claim 4, wherein said threshold level is determined to be an optimum value for each photodetecting means.

6. An optical pickup device according to claim 1, wherein an alarm means operates in response to the output of said mode change signal from said mode change detecting circuit means.

7. An optical pickup device according to claim 1 wherein said semiconductor light emitting element is a laser diode.

8. An optical pickup device according to claim 1 wherein a base for fitting a housing enclosing said semiconductor light emitting element is fitted to a device body through a heat dissipating sheet high in the thermal conductivity.

9. An optical pickup device according to claim 8 wherein said semiconductor light emitting element is fitted with a heat dissipating fin.

10. An optical pickup device using a semiconductor light emitting element, comprising:
    a semiconductor light emitting element emitting a light beam from at least one end surface thereof;
    a beam splitting element for splitting said beam into a reflected beam and a passing beam;
    an objective lens for collecting one of said reflected beam and said passing beam from said beam splitting element and projecting said one beam onto an optical recording medium;
    an information photodetector means for receiving a beam reflected from said recording medium and reproducing the information recorded in said recording medium;
    a plurality of photodetecting means, wherein said photodetecting means applies photoelectric conversion signals to a photo output controlling means and receives a light beam emitted from a second end surface of said semiconductor light emitting element;
    a mode change detecting circuit means, operatively coupled with said photodetecting means for detecting the change in the intensity distribution of the light beam radiated from said semiconductor light emitting element by comparing the photoelectric conversion signals from said plurality of photodetecting means, and outputting a mode change signal; and
    said photo-output controlling means, is operatively coupled with said photodetecting means and said light emitting element and is provided for controlling the photo-output of said semiconductor light emitting element in response to the photoelectric conversion output signals from said photodetecting means.

11. An optical pickup device according to claim 10 wherein said photodetecting means receiving said light beam from said second end surface of said semiconductor light emitting element is a monitoring photodiode enclosed integrally with said semiconductor light emitting element.

12. An optical pickup device according to claim 11 wherein respective terminals of said semiconductor light emitting element and said monitoring photodiode are connected to a single connector.

13. An optical pickup device according to claim 12 wherein said connector is provided with a short-circuited terminal so as to interrupt the current flowing through said semiconductor light emitting element when said connector is not properly connected to a connector receiver.

14. An optical pickup device according to claim 13 wherein said photo-output controlling means, provided with the connector receiver capable of being connected with said connector, has a window type comparator which prevents a driving current from flowing through said semiconductor light emitting element unless a photoelectric current from said monitoring photodiode is above a predetermined reference value.

* * * * *